(12) United States Patent
Hirata

(10) Patent No.: US 12,094,700 B2
(45) Date of Patent: Sep. 17, 2024

(54) FILM FORMING METHOD, FILM FORMING APPARATUS, AND PROGRAM

(71) Applicant: TOKYO ELECTRON LIMITED, Tokyo (JP)

(72) Inventor: Toshiharu Hirata, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 17/469,228

(22) Filed: Sep. 8, 2021

(65) Prior Publication Data

US 2022/0074044 A1 Mar. 10, 2022

(30) Foreign Application Priority Data

Sep. 9, 2020 (JP) ................................ 2020-151531

(51) Int. Cl.
| | | |
|---|---|---|
| *C23C 14/34* | (2006.01) | |
| *C23C 14/35* | (2006.01) | |
| *C23C 14/54* | (2006.01) | |
| *H01J 37/34* | (2006.01) | |

(52) U.S. Cl.
CPC ...... *H01J 37/3482* (2013.01); *C23C 14/3464* (2013.01); *C23C 14/352* (2013.01); *C23C 14/54* (2013.01); *C23C 14/548* (2013.01); *H01J 37/3447* (2013.01); *H01J 37/3464* (2013.01); *H01J 37/347* (2013.01); *H01J 37/3479* (2013.01); *C23C 14/35* (2013.01); *H01J 37/3405* (2013.01)

(58) Field of Classification Search
CPC ... C23C 14/3464; C23C 14/352; C23C 14/54; C23C 14/548; H01J 37/347; H01J 37/3464; H01J 37/3479; H01J 37/3482; H01J 37/3476
See application file for complete search history.

(56) References Cited

U.S. PATENT DOCUMENTS

| | | | |
|---|---|---|---|
| 3,756,939 A | * | 9/1973 | Hurwitt ............... C23C 14/3407 204/298.26 |
| 5,292,419 A | * | 3/1994 | Moses ................. C23C 14/3407 204/298.26 |
| 7,324,865 B1 | | 1/2008 | Sonderman et al. |

(Continued)

FOREIGN PATENT DOCUMENTS

| | | |
|---|---|---|
| JP | 2009-529608 A | 8/2009 |
| JP | 2016-033244 A | 3/2016 |

(Continued)

*Primary Examiner* — Michael A Band
(74) *Attorney, Agent, or Firm* — Fenwick & West LLP

(57) ABSTRACT

There is provided a film forming method performed in a film forming apparatus having cathode units capable of installing a plurality of targets. The method comprises performing a film formation process using a first target between the first target and a second target that are disposed at the cathode units and are made of the same material, based on a recipe of the first target, receiving from a user, after a value for managing a lifespan of the first target has reached a predetermined threshold, selection of the second target to be used for the film forming process, and performing the film forming process using the selected second target based on a recipe in which setting of target-related control items of the recipe of the first target is converted for the selected second target.

2 Claims, 12 Drawing Sheets

(56) References Cited

U.S. PATENT DOCUMENTS

| | | | |
|---|---|---|---|
| 8,778,145 B2 | 7/2014 | Watanabe et al. | |
| 10,844,474 B2 | 11/2020 | Nakamura et al. | |
| 2005/0236266 A1* | 10/2005 | Poole | C23C 14/34 |
| | | | 204/298.03 |
| 2007/0068796 A1* | 3/2007 | Hsiao | H01J 37/3435 |
| | | | 204/192.1 |
| 2007/0209926 A1 | 9/2007 | Lee et al. | |
| 2007/0209932 A1 | 9/2007 | Sferlazzo et al. | |
| 2011/0259733 A1 | 10/2011 | Watanabe et al. | |
| 2015/0136596 A1 | 5/2015 | Nakamura et al. | |
| 2019/0194798 A1* | 6/2019 | Nakamura | C23C 14/351 |

FOREIGN PATENT DOCUMENTS

| | | |
|---|---|---|
| KR | 10-2005-0012804 A | 2/2005 |
| KR | 10-2019-0077549 A | 7/2019 |
| WO | WO 2004/001094 A1 | 12/2003 |
| WO | WO 2007/106732 A1 | 9/2007 |
| WO | WO 2010/076862 A1 | 7/2010 |
| WO | WO 2013/179548 A1 | 12/2013 |

\* cited by examiner

*FIG. 6*

| Target | Cathode | Total [kWh] | Warning [kWh] | Alarm [kWh] | Substitute Cathode | | | |
|---|---|---|---|---|---|---|---|---|
| Target1 | Mg | 0.000 | 140.000 | 150.000 | T1 | T2 | T3 | T4 |
| Target2 | Mg | 0.000 | 140.000 | 150.000 | T1 | T2 | T3 | T4 |
| Target3 | Mg | 0.000 | 140.000 | 150.000 | T1 | T2 | T3 | T4 |
| Target4 | Mg | 0.000 | 140.000 | 150.000 | T1 | T2 | T3 | T4 |

| Target | Cathode | Total [kWh] | Warning [kWh] | Alarm [kWh] | Substitute Cathode |
|---|---|---|---|---|---|
| Target1 | Mg | ⚠ 142.000 | 140.000 | 150.000 | T1 T2 T3 T4 |
| Target2 | Mg | 0.000 | 140.000 | 150.000 | T1 T2 T3 T4 |
| Target3 | Mg | 0.000 | 140.000 | 150.000 | T1 T2 T3 T4 |
| Target4 | Mg | 0.000 | 140.000 | 150.000 | T1 T2 T3 T4 |

FIG.8A 030  0x0501E858
PM02 Target1 life limit exceeded

| Target | Cathode | Total [kWh] | Warning [kWh] | Alarm [kWh] | Substitute Cathode |
|---|---|---|---|---|---|
| Target1 | Mg | ⚠ 142.000 | 140.000 | 150.000 | T1 T2 T3 T4 |
| Target2 | Mg | 3.000 | 140.000 | 150.000 | T1 T2 T3 T4 |
| Target3 | Mg | 0.000 | 140.000 | 150.000 | T1 T2 T3 T4 |
| Target4 | Mg | 0.000 | 140.000 | 150.000 | T1 T2 T3 T4 |

FIG. 9B

| Target Shutter | T1 Close | T1 Open | T1 Close |
|---|---|---|---|
| RotationStage Position | Target1 | Target1 | |
| RotationStage Position Offset [deg] | 0.0 | 0.0 | 0.0 |
| Target1: DC Power [W] | | 200 | |
| Target1: DC Frequency [kHz] | | 0 | |
| Target1: DC Reverse Time [us] | | 0.0 | 0.0 |
| Target2: DC Power [W] | | 0 | |
| Target2: DC Frequency [kHz] | | 0 | |
| Target2: DC Reverse Time [us] | | 0.0 | |

FIG. 9C

| | T2 Close | T2 Open | T2 Close |
|---|---|---|---|
| | Target2 | Target2 | |
| | 0.0 | 0.0 | 0.0 |
| | | 0 | |
| | | 0 | |
| | | 0.0 | |
| | | 200 | |
| | | 0 | |
| | | 0.0 | |

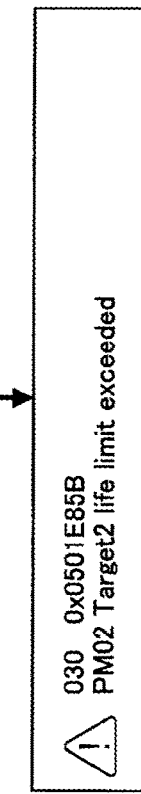

ically known.
FILM FORMING METHOD, FILM FORMING APPARATUS, AND PROGRAM

CROSS-REFERENCE TO RELATED APPLICATIONS

This application claims priority to Japanese Patent Application No. 2020-151531, filed on Sep. 9, 2020, the entire contents of which are incorporated herein by reference.

TECHNICAL FIELD

The present disclosure relates to a film forming method, a film forming apparatus, and a program.

BACKGROUND

For example, a film forming apparatus having a plurality of metal targets and configured to form a metal oxide film on an object to be processed has been conventionally known. The metal target may be arbitrarily selected depending on a type of a metal oxide film to be formed (see, e.g., Japanese Patent Application Publication No. 2016-33244).

SUMMARY

The present disclosure provides a technique for improving an operating rate of a film forming apparatus in which a plurality of targets can be equipped.

In accordance with an aspect of the present disclosure, there is provided a film forming method performed in a film forming apparatus having cathode units capable of installing a plurality of targets. The method comprises performing a film formation process using a first target between the first target and a second target that are disposed at the cathode units and are made of the same material, based on a recipe of the first target, receiving from a user, after a value for managing a lifespan of the first target has reached a predetermined threshold, selection of the second target to be used for the film forming process, and performing the film forming process using the selected second target based on a recipe in which setting of target-related control items of the recipe of the first target is converted for the selected second target.

BRIEF DESCRIPTION OF THE DRAWINGS

The objects and features of the present disclosure will become apparent from the following description of embodiments, given in conjunction with the accompanying drawings, in which:

FIG. 6 is an image diagram of an example of a substitute cathode screen according to the embodiment;

FIGS. 8A and 8B are image diagrams of an example of the substitute cathode screen according to the embodiment;

FIGS. 9A to 9C explain changes in setting of target-related control items of a recipe at the time of switching targets;

FIGS. 10A and 10B are image diagrams of an example of the substitute cathode screen according to the embodiment;

DETAILED DESCRIPTION

Hereinafter, embodiments for implementing the present disclosure will be described with reference to the accompanying drawings.

<System Configuration>

Figure 1:
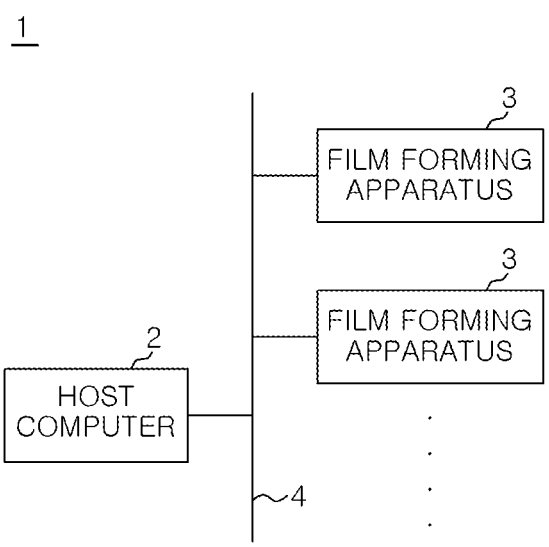
FIG. 1 shows a configuration of an example of a semiconductor manufacturing system according to an embodiment.

FIG. 1 shows a configuration of an example of a semiconductor manufacturing system according to an embodiment. In the semiconductor manufacturing system 1 shown in FIG. 1, a host computer 2 and one or more film forming apparatuses 3 are connected through a network 4 capable of performing data communication, such as a local area network (LAN) or the like.

The host computer 2 is an example of a man-machine interface (MMI) that provides information on the film forming apparatus 3 to an operator as an example of a user. The host computer 2 receives, from the operator, parameter setting such as system parameter setting or the like. The host computer 2 receives setting of recipes such as a processing recipe, a maintenance recipe, an allowance recipe, and the like from the operator. The host computer 2 receives instructions related to product management (lot management) and production management (batch management) from the operator. The host computer 2 provides the parameter setting and the recipe setting to the film forming apparatus 3.

In response to a job execution request from the host computer 2, the film forming apparatus 3 transfers a substrate to be processed to, e.g., a process module for forming an Mg film, and forms an Mg film on the substrate. The substrate is, e.g., a semiconductor wafer. In the present embodiment, a substrate transferred to the process module is lot-controlled.

The configuration of the semiconductor manufacturing system 1 shown in FIG. 1 is an example, and the semiconductor manufacturing system 1 may have various system configurations depending on applications or purposes. The case in which the apparatus is divided into the host computer 2 and the film forming apparatuses 3 shown in FIG. 1 is an example.

For example, the semiconductor manufacturing system 1 may have various configurations such as a configuration in which the host computer 2 and the film forming apparatus 3 are integrated, a configuration in which the system is divided into further components, and the like. The host computer 2 may collectively handle a plurality of film forming apparatus 3 as in the semiconductor manufacturing system 1 of FIG. 1, or may be provided one-to-one with the film forming apparatus 3.

<Configuration of Film Forming Apparatus>

Figure 2:
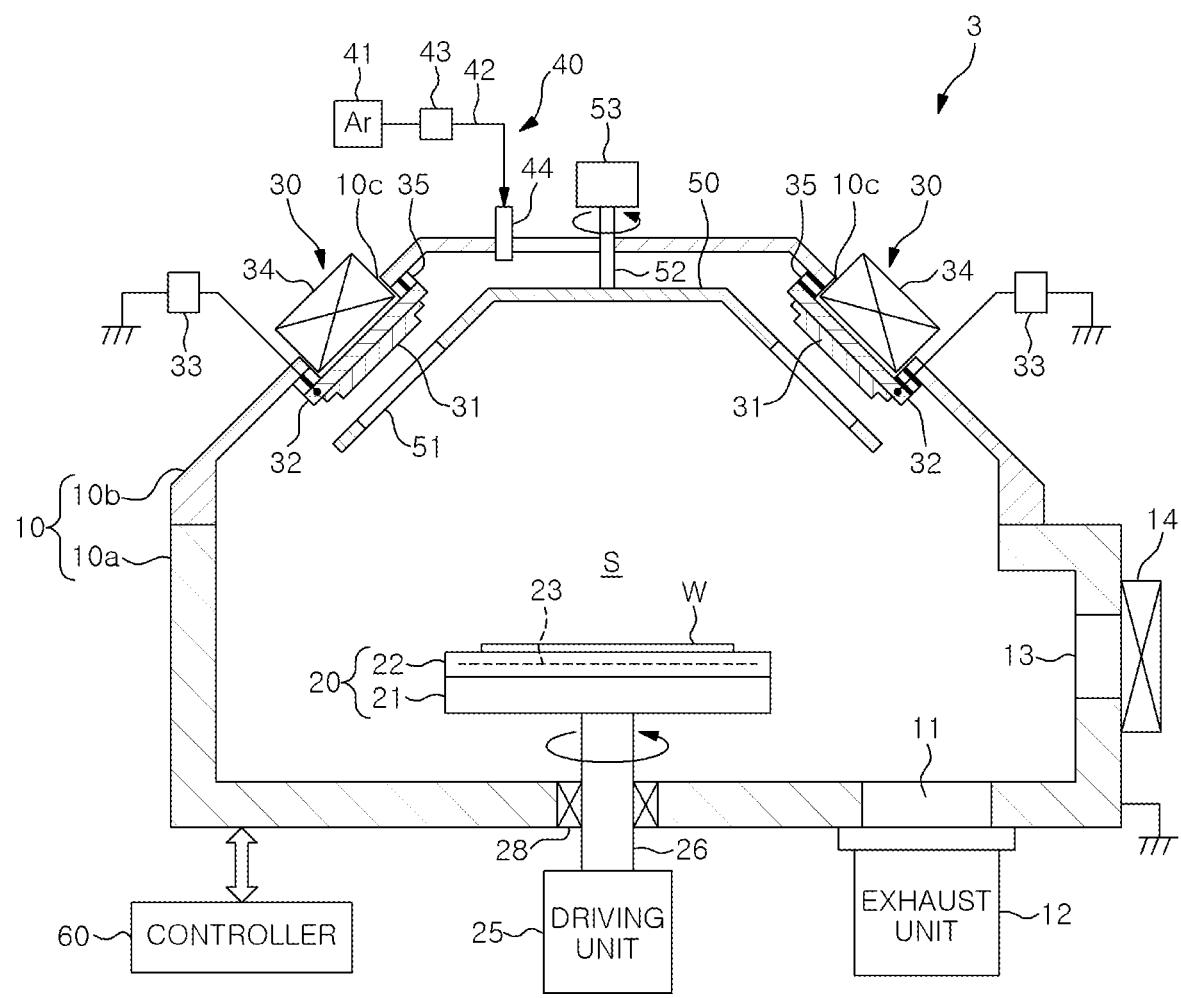
FIG. 2 is a cross-sectional view of an example of a film forming apparatus having cathode units according to the embodiment.
Figure 3:
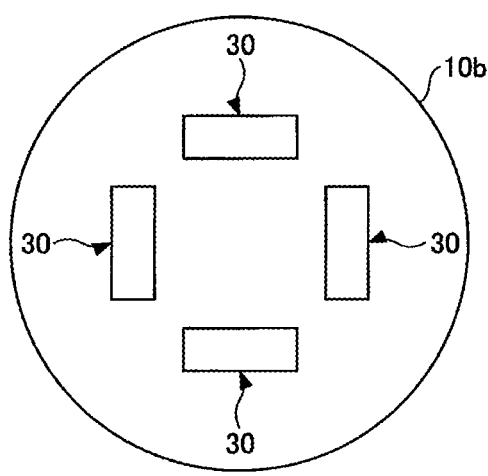
FIG. 3 is a schematic plan view of an example of the film forming apparatus having the cathode units according to the embodiment.

FIG. 2 is a cross-sectional view of an example of a film forming apparatus having cathode units according to the embodiment. FIG. 3 is a schematic plan view of an example of the film forming apparatus having the cathode units according to the embodiment. The film forming apparatus 3 of the present embodiment forms a film of a metal, an alloy, or a compound on the substrate W by sputtering. The substrate W is not particularly limited, and may be a semiconductor wafer having a semiconductor base such as Si or the like.

The film forming apparatus 3 includes a processing container 10, a substrate holder 20, cathode units 30, a gas supply unit 40, a shutter 50, and a controller 60. The processing container 10 is made of, e.g., aluminum, and defines a processing chamber for processing the substrate W. The processing container 10 is connected to a ground potential. The processing container 10 has a container main body 10a having an upper opening and a lid 10b disposed to cover the upper opening of the container main body 10a. The lid 10b has a substantially truncated cone shape.

An exhaust port 11 is formed at a bottom portion of the processing container 10. An exhaust unit 12 is connected to the exhaust port 11. The exhaust unit 12 includes a pressure control valve and a vacuum pump. The exhaust unit 12 evacuates the inside of the processing container 10 to a predetermined degree of vacuum. A loading/unloading port 13 for loading/unloading the substrate W into/from an adjacent transfer chamber (not shown) is formed on a sidewall of the processing container 10. The loading/unloading port 13 is opened/closed by a gate valve 14.

The substrate holder 20 has a substantially disc shape and is disposed near the bottom portion in the processing container 10 to hold the substrate W horizontally. The substrate holder 20 has a base portion 21 and an electrostatic chuck 22. The base portion 21 is made of, e.g., aluminum. The electrostatic chuck 22 is made of a dielectric material and has an electrode 23 therein. A DC voltage is applied from a DC power supply (not shown) to the electrode 23, and the substrate W is attracted and held on the surface of the electrostatic chuck 22 by an electrostatic force generated by the DC voltage. Further, a temperature control mechanism (not shown) may be disposed in the substrate holder 20. The temperature control mechanism may be, e.g., a mechanism that allows a temperature control medium to flow through the substrate holder 20 or a heater.

The substrate holder 20 is connected to a driving unit 25 disposed below the processing container 10 through a support shaft 26. The support shaft 26 extends from the driving unit 25 through a bottom wall of the processing container 10, and a tip end of the support shaft 26 is connected to the center of the bottom surface of the substrate holder 20. The driving unit 25 is configured to rotate and vertically move the substrate holder 20 using the support shaft 26. The space between the support shaft 26 and the bottom wall of the processing container 10 is sealed by a sealing member 28. By providing the sealing member 28, the support shaft 26 can rotate and vertically move while maintaining the inside of the processing container 10 in a vacuum state. The sealing member 28 may be, e.g., a magnetic fluid seal.

Each cathode unit 30 includes a target 31 and is disposed on an inclined surface of the lid 10b of the processing container 10. As shown in FIGS. 2 and 3, in the present embodiment, four cathode units 30 are spaced apart from each other at equal intervals at the same height. The number of cathode units is not limited thereto, and may be plural. The cathode units 30 will be described in detail later.

The gas supply unit 40 includes a gas supply source 41, a gas supply line 42, a flow rate controller 43, and a gas introducing member 44. The gas supply line 42 extends from the gas supply source 41 to the gas introducing member 44. The flow rate controller 43 is a mass flow controller or the like disposed in the gas supply line 42.

An inert gas as a plasma generating gas excited in the processing container 10, e.g., an inert gas such as Ar, Ne, Kr or the like (Ar gas is illustrated in FIG. 2, for example), is supplied from the gas supply source 41 into the processing container 10 through the gas supply line 42 and the gas introducing member 44. The gas supplied into the processing container 10 is excited by applying a voltage to the target 31.

The shutter 50 has a function of shielding the targets 31. The shutter 50 has a truncated cone shape corresponding to the shape of the lid 10b of the processing container 10 and has a size that covers projection areas of four targets 31. Further, the shutter 50 has openings 51 that are slightly larger than the targets 31. The target 31 used for film formation is not shielded by the opening 51 of the shutter 50. Further, the other targets 31 that are not used for film formation are shielded by the shutter 50. The shutter 50 is rotatable about a rotation shaft 52 disposed at the center of a ceiling portion of the processing container 10. The rotation shaft 52 is connected to a rotation mechanism 53 disposed above the processing container 10. The shutter 50 is rotated by the rotation mechanism 53.

Further, the cathode unit 30 includes the target 31, a target cooling unit 32, a power supply 33, and a magnet assembly 34. The target cooling unit 32 holds and cools the target 31. The power supply 33 supplies a power to the target 31 held by the target cooling unit 32. The targets 31 are made of a metal, an alloy, or a compound that forms a film to be deposited, and has a rectangular planar shape. The material of the targets 31 is appropriately selected depending on the film to be formed.

The targets 31 may be made of a low thermal conductivity material, e.g., titanium (Ti) or ceramic (alumina or the like), having a thermal conductivity lower than that of cobalt (Co). The four targets 31 may be made of different materials or may be made of the same material. In the case of using a substitute cathode function of the present embodiment, the four targets 31 are made of the same material. Sputter particles are emitted by applying a voltage to the target 31. At the time of film formation, a voltage is applied to one or more targets 31 to emit sputter particles.

The target cooling unit 32 is disposed inside a hole 10c formed on the inclined surface of the lid 10b of the processing container 10 via an insulating member 35. The target cooling unit 32 is disposed on a back surface side of the target 31. The power supply 33 is configured to supply a power to the target 31 through the target cooling unit 32. The power supply 33 may be a DC power supply or an AC power supply. For example, the DC power supply is used as the power supply 33 when the target 31 is made of a conductive material, and the AC power supply is used as the power supply 33 when the target 31 is made of an insulating material.

The magnet assembly 34 is disposed on the opposite side of the target cooling unit 32 from the target 31. The magnet assembly 34 has two magnets and a magnet driving unit. The two magnets for applying a leakage magnetic field to the target 31 to perform magnetron sputtering are disposed such that the longitudinal directions thereof coincide with the lateral direction of the target 31. The two magnets are provided so as to be swingable in the longitudinal direction of the target 31, and are driven by the magnet driving unit. The two magnets are spaced apart from each other at a gap and are swingable while maintaining the gap. At the time of sputter film formation, the leakage magnetic field becomes uniform by swinging the two magnets.

Figure 4:
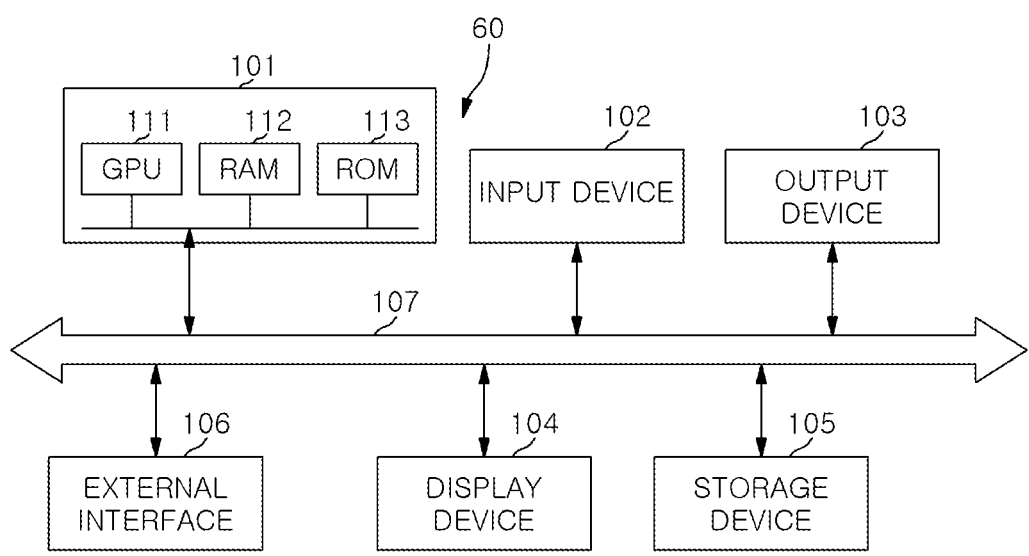
FIG. 4 shows a hardware configuration of an example of a controller.

The controller 60 is, e.g., a computer having a configuration shown in FIG. 4, and controls individual components of the film forming apparatus 3. FIG. 4 shows a hardware configuration of an example of the controller. The controller 60 includes a main controller 101, an input device 102, an output device 103, a display device 104, a storage device 105, an external interface 106, and a bus 107 that connects them to each other. The input device 102 is a keyboard, a mouse, a touch panel, or the like. The output device 103 is a printer or the like. The display device 104 is a display or the like.

The main controller 101 includes a central processing unit (CPU) 111, a random access memory (RAM) 112, and a read only memory (ROM) 113. The storage device 105 is configured to record and read programs or information required for control. The storage device 105 has a computer-readable storage medium such as a hard disk drive (HDD) or the like. The storage medium stores parameter setting, recipe setting, or the like provided from the host computer 2.

In the controller 60, the CPU 111 uses the RAM 112 as a work area and causes the film forming apparatus 3 to perform desired film formation (film forming process) based on the program, the parameter setting, the recipe setting, or the like read from the ROM 113 or the storage medium of the storage device 105.

Figure 5:
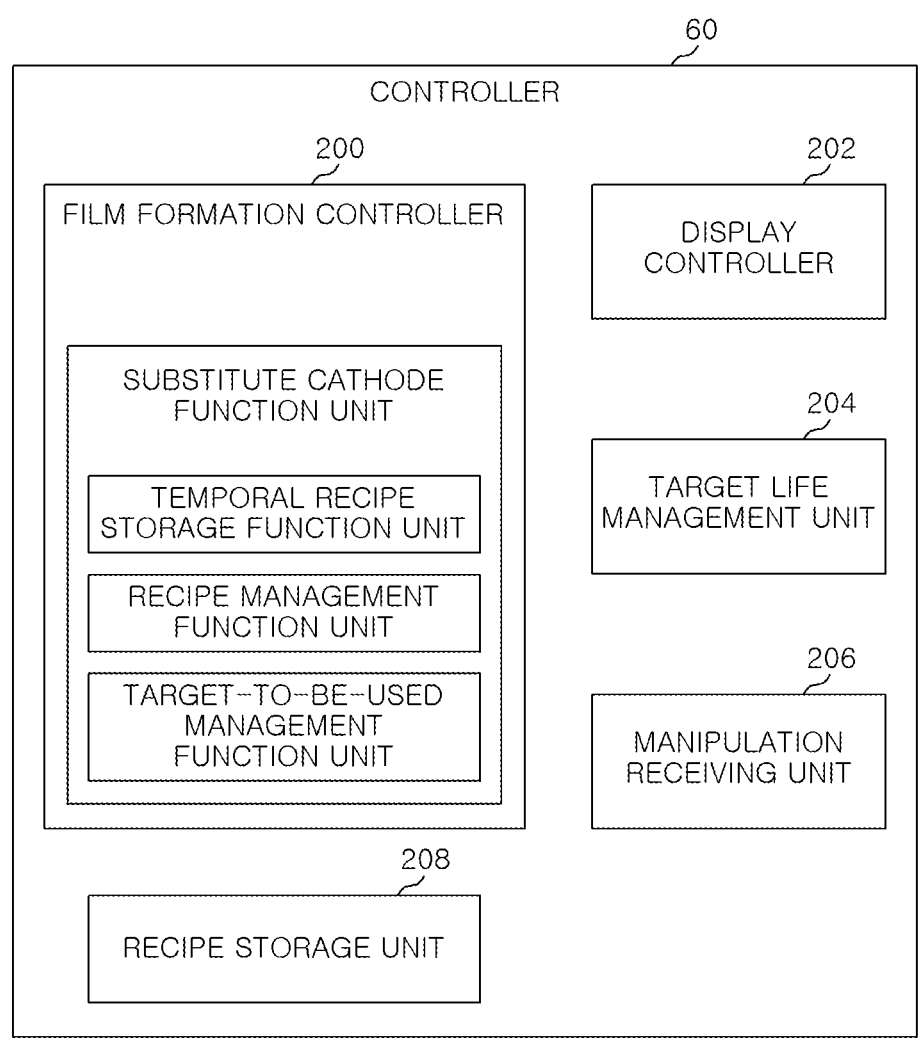
FIG. 5 is a functional block diagram of an example of the controller.

FIG. 5 is a functional block diagram of an example of the controller. The controller 60 of FIG. 5 includes a film formation controller 200, a display controller 202, a target life management unit 204, a manipulation receiving unit 206, and a recipe storage unit 208. Here, the illustration and the description of the functions of the controller 60 that are not used in the description of the present embodiment will be omitted.

The film formation controller 200 controls a film forming process. The film formation controller 200 has the substitute cathode function unit according to the present embodiment. The substitute cathode function unit includes a temporal recipe storage function unit, a recipe management function unit, and a target-to-be-used management function unit. The substitute cathode function unit allows a substitute cathode according to the present embodiment to be controlled. The temporal recipe storage function unit allows the parameter setting or the recipe setting used for the film forming process to be read out and temporarily stored in the RAM 112.

The recipe storage unit 208 stores the parameter setting, the recipe setting, or the like provided from the host computer 2 in the storage device 105. The recipe management function unit allows the parameter setting, the recipe setting, or the like stored in the recipe storage unit 208 to be read out from the storage device 105, and instructs the temporal recipe storage function unit to temporarily store them in the RAM 112. Further, the recipe management function unit realizes the substitute cathode function according to the present embodiment by rewriting the parameter setting, the recipe setting, or the like stored in the RAM 112 by the temporal recipe storage function unit according to switching of the targets 31 to be used as will be described later and using them for the film forming process.

The target-to-be-used management function unit performs management of the target used for the film forming process in consideration of the lifespan of each target 31 of the cathode unit 30 to prevent the target 31 from reaching the lifespan (life end) during the film forming process for substrates of a lot set for a single control job (CJ). The control job is, e.g., an instruction of a processing unit in consideration of a lot in the film forming apparatus 3.

The display controller 202 displays a substitute cathode screen to be described later on the display device 104. The substitute cathode screen will be described in detail later. The target life management unit 204 manages the lifespan of the target 31 included in the cathode unit 30 by the amount of power (kWh) supplied to the target 31. The amount of power supplied to the target 31 is an example of a value for managing the lifespan of the target 31.

The manipulation receiving unit 206 receives selection of the target used for the film forming process from the operator by using a substitute cathode selector (to be described later) or the like displayed on the substitute cathode screen to be described later as an example of a display component that receives selection from the operator.
<Substitute Cathode Function>

The substitute cathode function according to the present embodiment allows a plurality of targets 31 made of the same material to be placed on the cathode units 30 and allows the film forming process to be consecutively performed while switching the targets 31 without opening the inside of the processing container 10 to the atmosphere, thereby extending a maintenance cycle and improving the operating rate of the film forming apparatus 3.

FIG. 6 is an image diagram of an example of a substitute cathode screen according to the present embodiment. The substitute cathode screen shown in FIG. 6 has a field 1000 for displaying a target number and a target name, a field 1002 for displaying "Total" indicating the amount of power supplied to the target 31, "Warning" indicating a warning threshold, and "Alarm" indicating an alarm threshold, and a field 1004 for displaying a substitute cathode selector.

The substitute cathode screen of FIG. 6 shows the case in which the cathode units 30 have four targets 31. Further, on the substitute cathode screen of FIG. 6, the target 31 having the target number "Target1" is a main cathode, and the targets having the target numbers "Target2" to "Target4" are examples of backup substitute cathodes.

Therefore, on the substitute cathode screen of FIG. 6, the substitute cathode selector having the target number "Target1" that is the main cathode is enabled. Further, on the substitute cathode screen of FIG. 6, the substitute cathode selectors having the target numbers "Target2" to "Target4" that are the substitute cathodes are disabled.

In the substitute cathode function according to the present embodiment, among the four targets 31, the target 31 that is used first is used as the main cathode, and the targets 31 other than the main cathode are used as the substitute cathodes. The main cathode is not limited to the target 31 that is used first, and may be the target 31 corresponding to the parameter setting or the recipe setting that is temporarily stored first in the RAM 112.

In the field 1002, "Total" indicating the amount of power supplied to the target 31 is an example of a value for managing the lifespan of each target 31, and the value thereof increases as the usage increases. In the field 1002, a smaller value of "Total" indicates a longer period of time until end of life end, and a larger value of "Total" indicates a shorter period of time until the end of life.

In the field 1002, "Warning" indicating the warning threshold is a set value of the amount of power supplied to the target 31 that warns the operator that the target 31 reaches its end of life. For example, on the substitute cathode screen of FIG. 6, warning is issued when the value of "Total" reaches "140.000 kWh".

In the field 1002, "Alarm" indicating the alarm threshold is a set value of the amount of power supplied to the target 31 that alarms the operator that the target 31 reaches its end of life, which is a state in which a period of time until the end of life is short compared to the warning threshold set in "Warning". For example, on the substitute cathode screen of FIG. 6, alarm is issued when the value of "Total" reaches "150.000 kWh".

The operator can select the target 31 to be used for the film forming process by manipulating the enabled substitute cathode selector of the target number "Target1" on the substitute cathode screen of FIG. 6. FIG. 6 shows an example in which the target 31 of the target number "Target1" is selected.

Figures 7A, 7B:
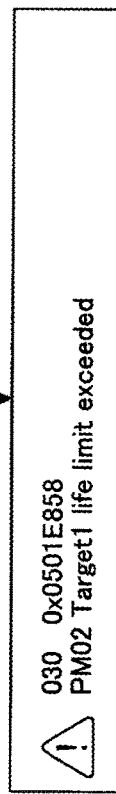
FIGS. 7A and 7B are image diagrams of an example of the substitute cathode screen according to the embodiment.

Since the power is supplied to the target 31 used for the film forming process, the value of "Total" on the substitute cathode screen increases as the film forming process is performed. When the value of "Total" on the substitute cathode screen reaches the set value of "Warning", the substitute cathode screen is displayed as shown in FIGS. 7A and 7B. FIGS. 7A and 7B are image diagrams of an example of the substitute cathode screen according to the present embodiment.

On the substitute cathode screen of FIG. 7A, the value of "Total", i.e., "142.000 kWh", has reached the set value of "Warning" so that the warning shown in FIG. 7B is issued. In a state where the warning shown in FIG. 7B is issued, an operator's operation of starting a new control job is prohibited. In a state where the warning shown in FIG. 7B is issued, the substitute cathode function stops the start of a new control job.

Further, by manipulating the enabled substitute cathode selector of the target number "Target1" on the substitute cathode screen of FIG. 7A, the operator can switch the target 31 to be used to the substitute cathode of the target number "Target2" as shown in FIG. 8A, for example.

FIGS. 8A and 8B are image diagrams of an example of the substitute cathode screen according to the present embodiment. The substitute cathode screen of FIG. 8A shows an example in which the target 31 of the target number "Target2" is selected among the substitute cathode selectors of the enabled target number "Target1".

The target 31 of the target number "Target1" in which the value of "Total" has reached the set value of "Warning" on the substitute cathode screen of FIG. 8A is no longer used by the manipulation of the operator, so that the warning is suppressed or deleted as shown in FIG. 8B. As shown in FIG. 8A, the value of "Total" of the target 31 of the target number "Target1" is maintained.

Since the value of "Total" of the target number "Target2" selected as a new target 31 to be used has not reached the set value of "Warning", the substitute cathode function according to the present embodiment allows the operator to start a new control job.

In the substitute cathode function according to the present embodiment, the setting of the target-related control items of the recipe such as the parameter setting, the recipe setting, or the like used by the target 31 before the switching is converted for the target 31 after the switching as shown in FIGS. 9B and 9C, for example, and used as a recipe of the target 31 after the switching.

FIGS. 9A to 9C explain changes in the setting of the target-related control items of the recipe at the time of switching targets. FIG. 9B shows an example of a recipe such as parameter setting, recipe setting, or the like used by the target 31 before the switching, and the setting of the target-related control items is "Target1". FIG. 9C shows an example of a recipe such as parameter setting, recipe setting, or the like used by the target 31 after the switching, and the setting of the target-related control items is "Target2".

In the substitute cathode function according to the present embodiment, by switching the target 31 to be used, the recipe such as the parameter setting, the recipe setting, or the like stored in the RAM 112 by the temporal recipe storage function is automatically rewritten by the target 31 after the switching. In the substitute cathode function according to the present embodiment, the recipe stored in the RAM 112 by the temporal recipe storage function is rewritten and used instead of rewriting the recipe stored in the recipe storage unit 208. Therefore, the rewritten recipe can be discarded after the film forming process.

In the substitute cathode function according to the present embodiment, it is not necessary to rewrite the parameter setting or the recipe setting of the host computer 2, which is strictly managed and not easy to rewrite, for the substitute cathode function. On the other hand, in the substitute cathode function according to the present embodiment, it is possible to switch the target 31 for discharging or monitoring by rewriting and using the setting of the target-related control items of the recipe such as the parameter setting, the recipe setting, or the like stored in the RAM 112 by the temporal recipe storage function.

When the value of "Total" of "Target2" on the substitute cathode screen reaches the set value of "Warning", the substitute cathode screen is displayed as shown in FIG. 10A. FIGS. 10A and 10B are image diagrams of an example of the substitute cathode screen according to the present embodiment.

In FIG. 10A, as in FIG. 7A, warning is issued when the value of "Total" of the target 31 that is being used reaches the set value of "Warning". In FIG. 10B, the target 31 to be used can be switched as in FIG. 8A.

In the substitute cathode function according to the present embodiment, it is possible to switch to another target 31 whose value of "Total" has not reached the set value of "Warning" as in the case of switching from "Target1" to "Target2". Therefore, in the substitute cathode function according to the present embodiment, when the four targets 31 are used, the film forming process can be performed while switching the four targets 31 while maintaining the vacuum state. Accordingly, the maintenance cycle can be extended by four times, and the operating rate of the film forming apparatus 3 can be improved.

Figure 11:
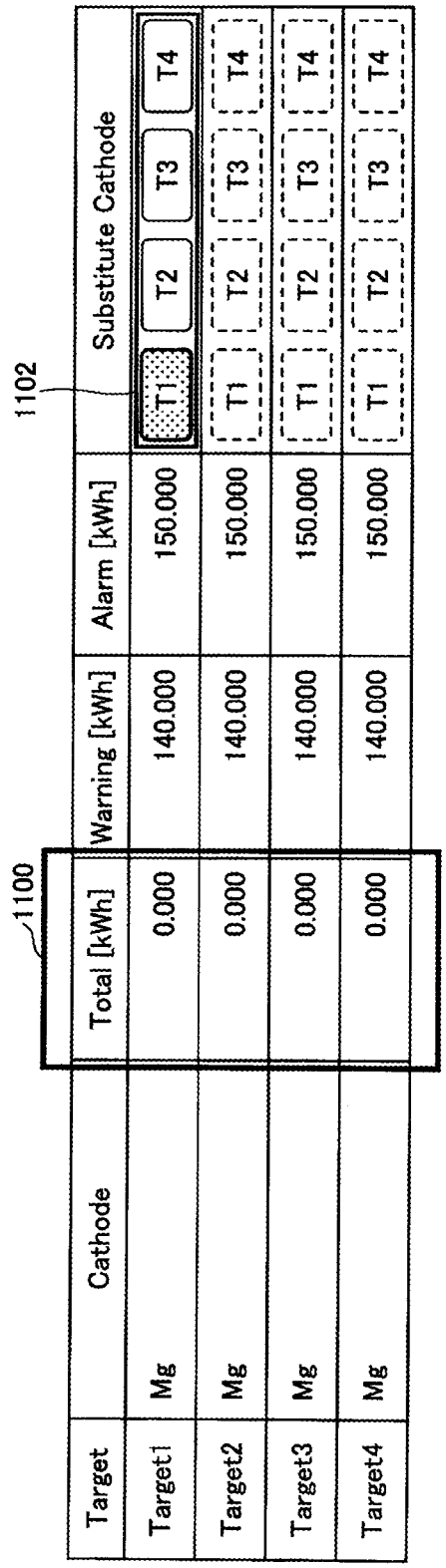
FIG. 11 is an image diagram of an example of the substitute cathode screen according to the embodiment.

When the values of "Total" of all the targets 31 included in the cathode units 30 have reached the set value of "Warning", the operator replaces the target 31 included in the cathode unit 30 with a new target 31 and clears (initializes) a maintenance counter. Accordingly, as shown in FIG. 11, the value of "Total" indicating the amount of power supplied to the target 31 can be returned to the initial value of "0.000 kWh". FIG. 11 is an image diagram of an example of the substitute cathode screen according to the present embodiment. The substitute cathode selector on the substitute cathode screen of FIG. 11 shows a state in which the target 31 of "Target 1" is selected again by initialization.

<Operation of Film Forming Apparatus>

Figure 12:
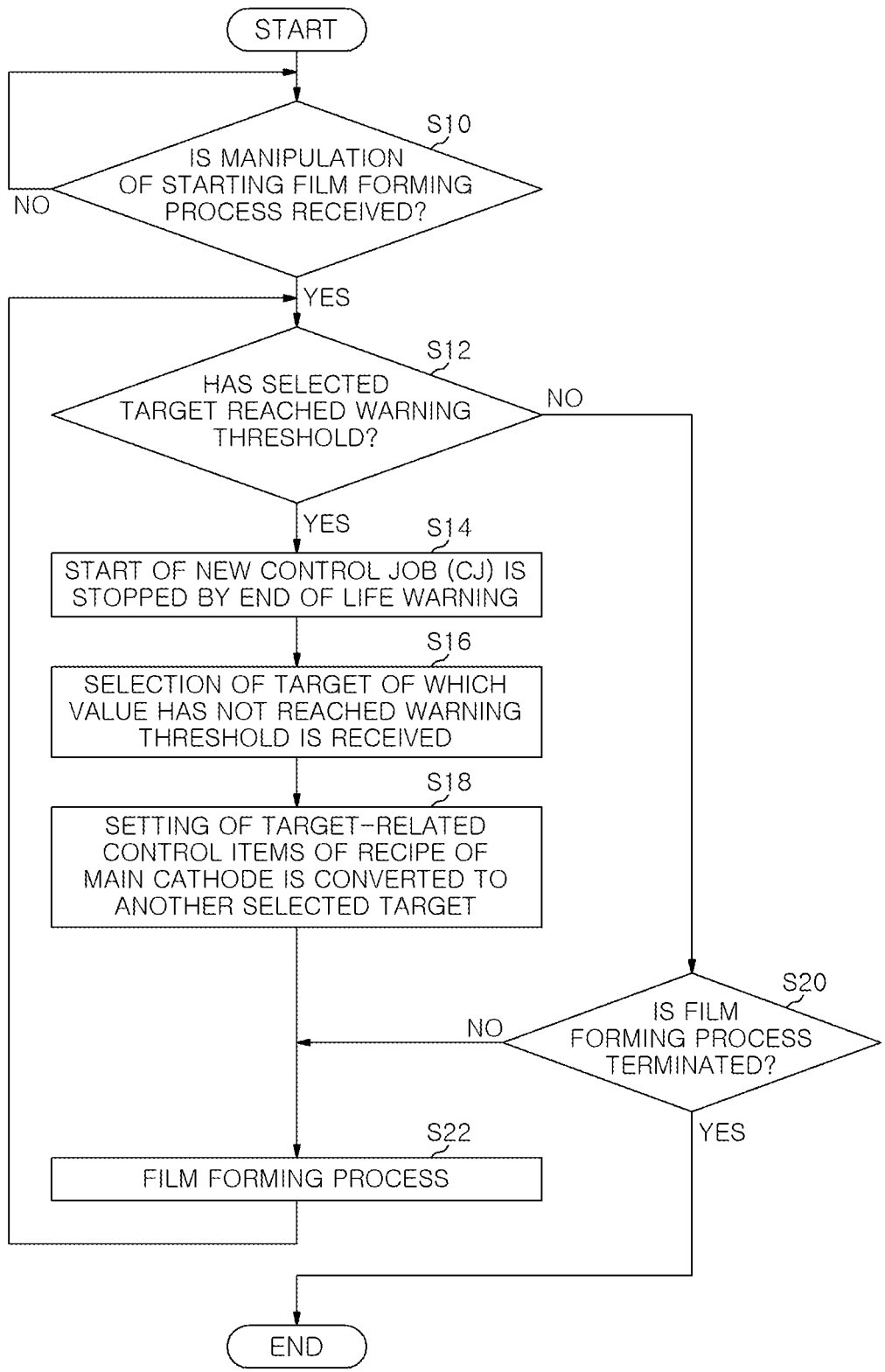
FIG. 12 is a flowchart showing an example of an operation of the film forming apparatus according to the embodiment.

Next, the operation of the film forming apparatus 3 will be briefly described. FIG. 12 is a flowchart showing an example of the operation of the film forming apparatus according to the present embodiment.

The film forming apparatus 3 proceeds to steps S10 to S12 by receiving the manipulation of starting the film forming process from the operator. In step S12, the film forming apparatus 3 determines whether or not the target 31 to be used (the selected target 31) that is selected on the above-described substitute cathode screen has reached a warning threshold.

If the value of "Total" of the selected target 31 has not reached the warning threshold, the film forming apparatus 3 performs the film forming process in step S22 until it is determined in step S20 that the film forming process is terminated.

Specifically, in the film forming apparatus 3, in step S22, the gate valve 14 is opened, and the substrate W is loaded into the processing container 10 from a transfer chamber (not shown) adjacent to the processing container 10 using a transfer device (not shown) and held by the substrate holder 20. The film forming apparatus 3 evacuates the inside of the processing container 10 to control a pressure in the processing container 10 to a predetermined pressure.

Next, the film forming apparatus 3 shields the selected target 31 with the shutter 50 and causes discharge to occur to clean the surface of the target. Next, the film forming apparatus 3 starts the film forming process in a state where unused targets 31 are shielded by the shutter 50 and the selected target 31 is not shielded by the opening 51.

The film forming apparatus 3 introduces an inert gas, e.g., Ar gas, into the processing container 10 from the gas supply unit 40. Then, the film forming apparatus 3 applies a voltage from the power supply 33 to the target 31 via the target cooling unit 32 to excite Ar gas. At this time, the leakage magnetic field of the two magnets is applied to the vicinity of the target 31, so that plasma is concentrated around the target 31 to form magnetron plasma. In this state, positive ions in the plasma collide with the target 31. Due to the collision of the positive ions, a constituent element of the target 31 is emitted as sputter particles. The sputter particles are deposited on the substrate W by magnetron sputtering.

During the film forming process, the film forming apparatus 3 monitors an increase in the amount of power supplied to the selected target 31. When it is detected that the amount of power supplied to the selected target 31 has reached the warning threshold, the processing proceeds to step 14. In step S14, the film forming apparatus 3 issues warning (end of life warning) as shown in FIG. 7B, for example, and stops the start of a new control job, i.e., the start of processing of a new lot or a new semiconductor wafer (substrate).

Then, the processing proceeds to step S16, and the film forming apparatus 3 receives from the substitute cathode selector an operation of switching to another target 31, i.e., an operation of selecting the target 31 of which value has not reached the warning threshold, as shown in FIG. 8A, for example.

Thereafter, the processing proceeds to step S18, and the film forming apparatus 3 converts the setting of the target-related control items of the recipe such as the parameter setting, the recipe setting, or the like used by the target 31 before the switching to the target 31 after the switching as shown in FIGS. 9B and 9C, for example, and uses it as a recipe of the target 31 after the switching. Then, the processing proceeds to step S22, and the film forming apparatus 3 performs the film forming process in step S22 until it is detected in step 12 that the amount of power supplied to the selected target 31 has reached the warning threshold (YES in step S12) or until it is determined that the film forming process is terminated (YES in step S20).

In the semiconductor manufacturing system 1 according to the present embodiment, in the film forming apparatus 3 using the substitute cathode function, the target 31 having the parameter setting or the recipe setting different from that managed by the host computer 2 is discharged. The host computer 2 may monitor the film forming process of the film forming apparatus 3 in consideration of the substitute cathode function according to the present embodiment.

While embodiments of the present disclosure have been described in detail, the present disclosure is not limited to the above-described embodiments and various modifications and substitutions may be added to the above-described embodiments without departing from the scope of the present disclosure. The target 31 which is the main cathode is an example of a first target disclosed in the claim. The target 31 which is the substitute cathode is an example of a second target disclosed in the claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method performed in a film forming apparatus having cathode units capable of installing a plurality of targets and a shutter having an opening in the shutter, the film forming method comprising:
    performing a film formation process using a first target among the plurality of targets including the first target and a plurality of second targets based on a recipe of the first target, the film formation process using the first target including rotating the shutter about an axis such that the opening in the shutter does not shield the first target and the shutter shields the plurality of second targets during the film formation process using the first target, wherein the first target and the plurality of second targets are disposed at the cathode units and are made of the same material, wherein a cathode unit including the first target is at a same height as cathode units including the plurality of second targets within a processing container of the film forming apparatus during the film formation process using the first target;
    displaying an amount of power supplied to the first target for sputtering during the film formation process during a lifespan of the first target by a display device included with the film forming apparatus;
    alarming when the amount of power supplied to the first target has reached a predetermined threshold that indicates end of life of each of the plurality of targets;
    receiving from a user, after the alarming when the amount of power supplied to first target has reached the predetermined threshold, selection of a second target to be used for the film formation process among the plurality of second targets; and
    performing the film formation process using the selected second target based on the recipe, the film formation process using the selected second target including rotating the shutter about the axis such that the opening in the shutter does not shield the selected second target and the shutter shields the first target and other second targets from the plurality of second targets during the film formation process using the selected second target, wherein a cathode unit in which the selected second target is installed is at the same height as the cathode unit in which the first target is installed during the film formation process using the selected second target.

2. The film forming method of claim 1, wherein the recipe includes a processing recipe and a maintenance recipe.

\* \* \* \* \*